United States Patent
Holzmann (10) Patent No.: US 9,287,823 B1
(45) Date of Patent: Mar. 15, 2016

(54) METHOD AND APPARATUS OF A SELF-BIASED RC OSCILLATOR AND RAMP GENERATOR

(71) Applicant: NUVOTON TECHNOLOGY CORPORATION, Hsinchu (TW)

(72) Inventor: Peter Holzmann, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/487,090

(22) Filed: Sep. 15, 2014

(51) Int. Cl.
*H03K 3/0231* (2006.01)
*H03B 1/02* (2006.01)
*H03L 1/02* (2006.01)
*H01L 29/772* (2006.01)

(52) U.S. Cl.
CPC .............. *H03B 1/02* (2013.01); *H01L 29/772* (2013.01); *H03L 1/02* (2013.01)

(58) Field of Classification Search
CPC .................................................. H03K 3/0231
USPC .................................................. 331/111, 143
See application file for complete search history.

(56) References Cited

U.S. PATENT DOCUMENTS

| | | | | |
|---|---|---|---|---|
| 5,668,508 A | * | 9/1997 | Pulvirenti | H03K 3/011 331/111 |
| 2007/0109062 A1 | * | 5/2007 | Brokaw | H03K 3/011 331/111 |
| 2013/0154692 A1 | | 6/2013 | Larsen et al. | |

* cited by examiner

*Primary Examiner* — Joseph Chang
(74) *Attorney, Agent, or Firm* — Kilpatrick Townsend & Stockton LLP (57) ABSTRACT

A self-biased RC (resistor-capacitor) oscillator and ramp generator circuit includes a combined current and voltage reference circuit for providing a reference current, a first reference voltage, and a second reference voltage. The combined current and voltage reference circuit includes a circuit branch of an NMOS transistor in a diode connection, a PMOS transistor in a diode connection, and a resistor coupled in series. The circuit also has a signal generating circuit that includes a capacitor. The signal generating circuit is configured to charge and discharge the capacitor between the first reference voltage and the second reference voltage. The self-biased RC oscillator and ramp generator circuit is configured to provide a ramp or saw tooth signal at a node of the capacitor and to provide an oscillator output signal at an output of the signal generating circuit.

20 Claims, 7 Drawing Sheets

METHOD AND APPARATUS OF A SELF-BIASED RC OSCILLATOR AND RAMP GENERATOR

CROSS-REFERENCES TO RELATED APPLICATIONS

NOT APPLICABLE

BACKGROUND OF THE INVENTION

The present invention relates generally to electronic circuits. More particularly, embodiments of the present invention relate to the field of integrated oscillator circuits for controllers and, in particular, controllers for ultra-low power battery applications.

Figure 1:
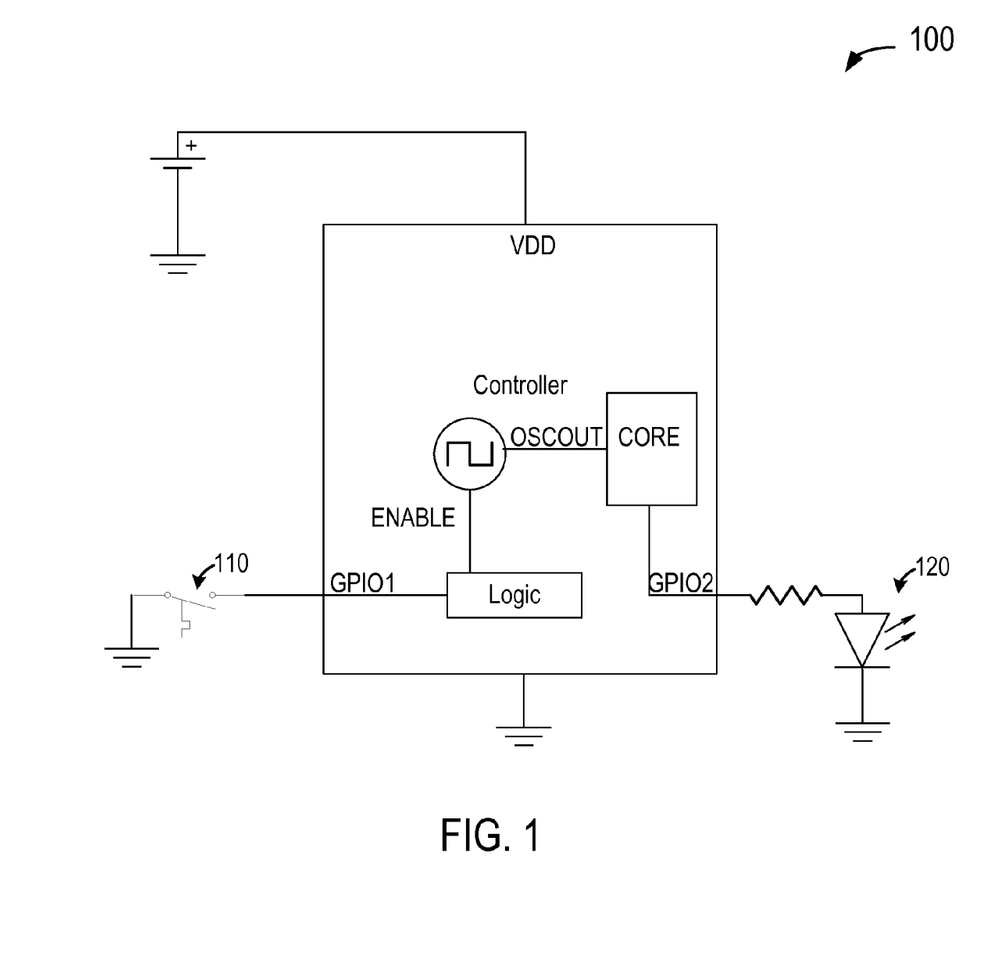
FIG. 1 is a simplified block diagram illustrating a system in which a controller is configured for frequent power-on and power-off operations.

FIG. 1 is a simplified block diagram illustrating a system 100 in which a controller is configured for frequent power-on and power-off operations. In this example, the (micro)-controller circuit is in a power down state, while it monitors the state of a terminal GPIO1. In this example, GPIO1 is connected to a temperature actuated switch 110, which trips at a preset temperature. An LED (light-emitting-diode) 120 is used to indicate when the temperature actuated switch has tripped, based on operations performed by the controller core. When the temperature actuated switch trips, the logic powers up the controller and enables the oscillator, which provides signals to the core logic to compute the LED driver function. When the computation is completed, the controller goes back to the power down state and shuts down the oscillator. Since the function requires the oscillator to power up and down frequently, it is desirable to have a fast power up and power down time in order to reduce power consumption. Further, the oscillator circuit needs to be a low power circuit in order to save power and extend battery life.

In addition, integrated circuit oscillators are also used to provide clock signals and ramp signals (or sawtooth signals) in pulse width modulation (PWM) based systems, such as those used in switch mode power supplies (SMPS) and amplifier circuits.

Some conventional integrated circuit oscillators use ring oscillators with precision external voltage and current references. Other conventional integrated circuit oscillators use capacitor charging circuit, but also rely on external reference circuits and control circuits.

BRIEF SUMMARY OF THE INVENTION

The inventor of this invention has discovered that conventional integrated circuit oscillators often do not satisfy the fast startup and low power requirements for low power battery operations. As described above, conventional integrated circuit oscillators often require external current and voltage references, as well as complex circuits. Some conventional integrated circuit oscillators may use band gap circuits to provide reference voltages. These designs tend to result in complicated circuits and require high power consumption.

In embodiments of the present invention, a precision self-biased RC (resistor-capacitor) oscillator and ramp generator has a combined current reference and voltage references comprised of a circuit branch of a single NMOS diode, a single PMOS diode and a resistor. By combining the voltage and current references into one circuit branch, the reference circuit is simplified. Further, at a given time, part of the self-biased RC oscillator and ramp generator circuit is disabled. The circuit is configured to provide low power consumption and enables fast startup. Moreover, the oscillator frequency can be precisely determined by the values of one resistance and one capacitance.

According to an embodiment of the present invention, a self-biased RC (resistor-capacitor) oscillator and ramp generator circuit includes a combined current and voltage reference circuit for providing a reference current, a first reference voltage, and a second reference voltage. The combined current and voltage reference circuit includes a circuit branch consisting of a diode-connected first PMOS transistor, a resistor R0, and a diode-connected first NMOS transistor coupled in series. The self-biased RC oscillator and ramp generator circuit also has a signal generating circuit that includes a capacitor. The signal generating circuit is configured to charge the capacitor from the first reference voltage to the second reference voltage and to discharge the capacitor from the second reference voltage to the first reference voltage. The self-biased RC oscillator and ramp generator circuit is configured to provide a ramp (or saw tooth) signal at a node of the capacitor and to provide an oscillator output signal at an output of the signal generating circuit.

In an embodiment of the above circuit, the combined current and voltage reference circuit and the signal generating circuit are implemented in a single integrated circuit.

In an embodiment of the above circuit, the self-biased RC oscillator and ramp generator circuit is configured to provide a oscillation frequency of $\frac{1}{2}R_0C_0$, wherein $R_0$ is the resistance of the resistor in the circuit branch of the combined current and voltage reference circuit, and $C_0$ is the capacitance of the capacitor.

In another embodiment, in the combined current and voltage reference circuit, a source of the first PMOS transistor is coupled to a power supply, and a gate and a drain of the first PMOS transistor are coupled at a first node, which is coupled to a first terminal of the resistor. A source of the first NMOS transistor is coupled to a ground, and a gate and a drain of the first NMOS transistor are coupled at a second node, which is coupled to a second terminal of the resistor. The current and voltage reference circuit is configured to provide, the first reference voltage at the first node, the second reference voltage at the second node, and the reference current flowing through the resistor between the first node and the second node.

In another embodiment, the self-biased RC oscillator and ramp generator circuit also includes a temperature compensation circuit coupled between the first node and the second node. In a specific embodiment, the temperature compensation circuit includes a first transistor, a second transistor, and a resistor couple in series between a power supply terminal and a ground terminal. The self-biased RC oscillator and ramp generator circuit also has a third transistor and a fourth transistor couple in series between the power supply terminal and the ground terminal. The first and the third transistors have the same channel width to length (W/L) ratio and form a first current mirror. The second transistor has a greater channel width to length (W/L) ratio than the W/L ratio of the fourth transistor, and the second and the fourth transistors forming a second current mirror. A fifth transistor has a source coupled to the power supply, a gate is coupled to the gates of the first and the third transistors, and a drain configured for coupling to the first node of the combined voltage and current reference circuit. A sixth transistor has a source coupled to the ground, a gate is coupled to the gates of the second and the fourth transistors, and a drain configured for coupling to the second node of the combined voltage and current reference circuit.

In another embodiment, the signal generating circuit includes a second PMOS transistor coupled to the first PMOS transistor to form a first current mirror, a second NMOS transistor coupled to the first NMOS transistor to form a second current mirror. The signal generating circuit also includes a first differential pair circuit coupled to the second PMOS transistor to receive the reference current, and a second differential pair circuit coupled to the second NMOS transistor to receive the reference current. The first differential pair circuit includes a third PMOS transistor and a fourth PMOS transistor, and the second differential pair circuit includes a third NMOS transistor and a fourth NMOS transistor. A drain of the third PMOS transistor and a drain of the third NMOS transistor are coupled at a third node, which is coupled to the capacitor for charging and discharging the capacitor, the third node also being configured to provide a ramp signal.

In another embodiment, the signal generating circuit also includes a first comparator and a second comparator. The first comparator circuit a positive input coupled to the third node to sense the voltage on the capacitor and a bias terminal coupled to a drain of the fourth NMOS transistor of the signal generating circuit. A second comparator circuit includes a negative input coupled to the third node to sense the voltage on the capacitor and a bias terminal coupled to a drain of the fourth PMOS transistor of the signal generating circuit. Gate voltages of the third PMOS transistor, the fourth PMOS transistor, the third NMOS transistor, and the fourth NMOS transistor are related to outputs of the first and the second comparators.

In another embodiment, the signal generating circuit also includes a lath that includes a set input coupled to the output of the first comparator, a reset input coupled to the output of the second comparator, a positive output coupled to the gate of the third PMOS transistor and the gate of the third NMOS transistor, and a negative output coupled to the gate of the fourth PMOS transistor and the gate of the fourth NMOS transistor. The positive output is configured to provide the oscillator output signal, and the negative output is configured to provide the complementary oscillator output signal.

In another embodiment, the signal processing circuit is configured to enable the first comparator and disable the second comparator when the capacitor is being charged. The signal processing circuit is configured to disable the first comparator and to enable the second comparator when the capacitor is being discharged. In an embodiment, the first comparator includes a current source coupled to the power supply terminal, a differential pair coupled to the current source, and a bias node coupled to the differential pair. The second comparator includes a current source coupled to the ground terminal, a differential pair coupled to the current source, and a bias node coupled to the differential pair. In another embodiment, the first comparator includes a first transistor having a source coupled to the power supply terminal, a gate coupled to the positive input node of the comparator, a drain for providing the output of the comparator, and a bias node coupled to the drain of the first transistor. The second comparator includes a first transistor having a source coupled to the ground terminal, a gate coupled to the negative input node of the comparator, a drain for providing the output of the comparator, and a bias node coupled to the drain of the first transistor.

According to another embodiment of the present invention, a self-biased RC oscillator and ramp generator circuit includes a combined current and voltage reference circuit for providing a reference current, a first reference voltage, and a second reference voltage. The combined current and voltage reference circuit includes a circuit branch having a first NMOS transistor, a first PMOS transistor, and a resistor coupled in series. The self-biased RC oscillator and ramp generator circuit also includes a capacitor and is to charge and discharge the capacitor between the first reference voltage and the second reference voltage.

In an embodiment of the above circuit, the signal generating circuit is configured to provide a charging current and a discharging current that are equal in magnitude to a current determined by the difference between the first reference voltage and the second reference voltage divided by the resistance of the resistor.

In an embodiment, in the combined current and voltage reference circuit, a gate and a drain of the first PMOS transistor are coupled at a first node, which is coupled to a first terminal of the resistor. A gate and a drain of the first NMOS transistor are coupled at a second node, which is coupled to a second terminal of the resistor. The current and voltage reference circuit is configured to provide the first reference voltage at the first node, the second reference voltage at the second node, and the reference current flowing through the resistor between the first node and the second node.

In another embodiment, the first NMOS transistor is in a diode connection with its gate and drain connected together, and the first PMOS transistor is in a diode connection with its gate and drain connected together.

In another embodiment, the self-biased RC oscillator and ramp generator circuit is configured to provide a oscillation frequency of $\frac{1}{2}R_0C_0$, wherein $R_0$ is the resistance of the resistor in the circuit branch of the combined current and voltage reference circuit, and $C_0$ is the capacitance of the capacitor.

In another embodiment, the signal generating circuit includes a first differential pair and a first comparator for charging the capacitor, and a second differential pair and a second comparator for charging the capacitor. The second comparator is disabled during the charging of the capacitor, and the first comparator is disabled during the discharging of the capacitor.

A further understanding of the nature and advantages of the present invention may be realized by reference to the remaining portions of the specification and the drawings.

DETAILED DESCRIPTION OF THE INVENTION

The description below will make reference to a series of drawing figures enumerated above. These diagrams are merely an example and should not unduly limit the scope of the claims herein. In connection with the various aspects illustrated and described, one of ordinary skill in the art would recognize other variations, modifications, and alternatives.

Figure 2:
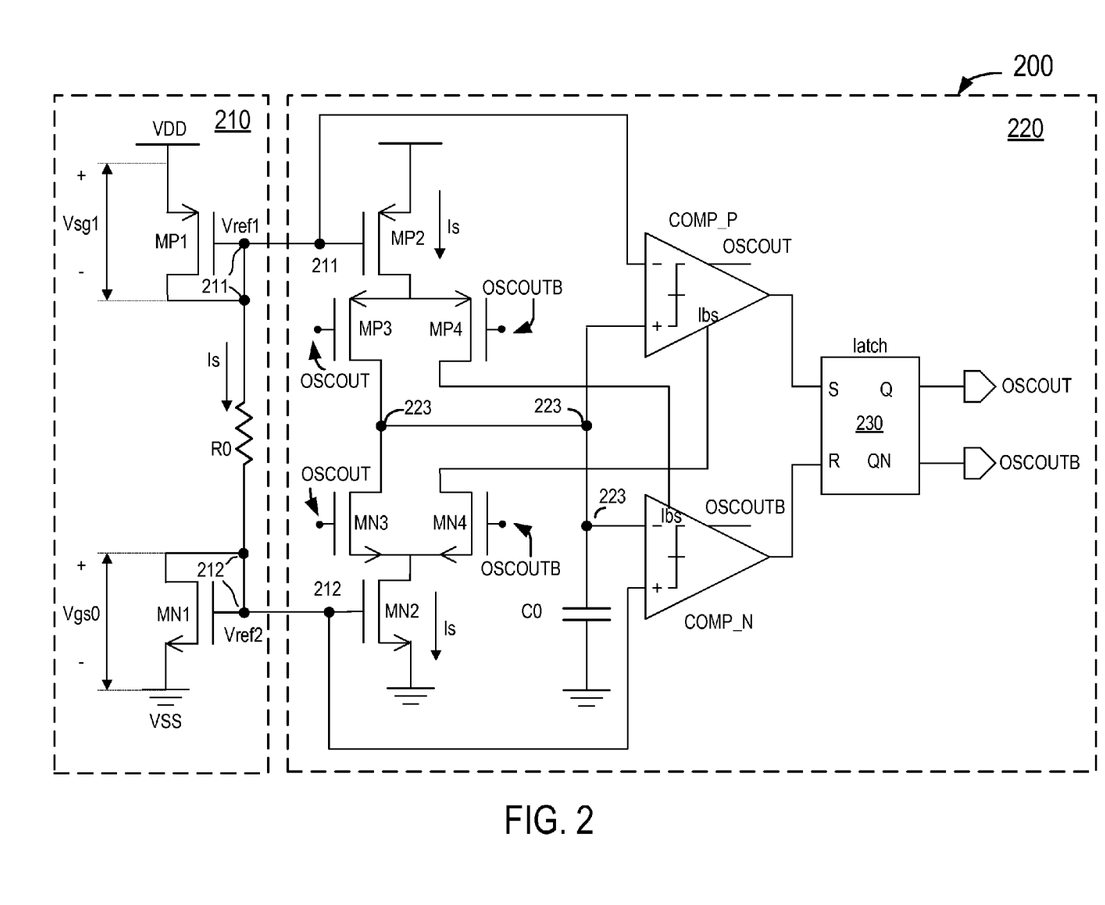
FIG. 2 is a simplified schematic diagram illustrating a self-biased RC oscillator and ramp generator according to an embodiment of the present invention.

FIG. 2 is a simplified schematic diagram illustrating an integrated circuit self-biased RC oscillator and ramp generator circuit 200 according to an embodiment of the present invention. As shown in FIG. 2, self-biased RC oscillator and ramp generator circuit 200 includes a combined current and voltage reference circuit 210 for providing a reference current Is, a first reference voltage Vref1, and a second reference voltage Vref2. Combined current and voltage reference circuit 200 includes a circuit branch of a first PMOS transistor MP1 in a diode connection, a resistor R0, and a first NMOS transistor MN1 in a diode connection coupled in series. Oscillator and ramp generator circuit 200 also has a signal generating circuit 220 that includes a capacitor C0 and is configured to charge and discharge the capacitor between the first reference voltage and the second reference voltage. The self-biased RC oscillator and ramp generator circuit is configured to provide oscillator output signals OSCOUT and OSCOUTB. The self-biased RC oscillator and ramp generator circuit is also configured to provide a ramp or saw tooth signal at a node 223 of the capacitor. In an embodiment, the output signal OSCOUT and an inverted output signal OSCOUTB, as well as the ramp signal, have a oscillation frequency of ½R0C0, wherein R0 is the resistance of resistor R0 in combined current and voltage reference circuit 210, and C0 is the capacitance of capacitor C0 in signal generating circuit 220.

As shown in FIG. 2, in combined current and voltage reference circuit 210, a source node of the first PMOS transistor MP1 is coupled to a power supply VDD. A gate node and a drain node of the first PMOS transistor MP1 are coupled at a first node 211, which is coupled to a first terminal of resistor R0. A source of the first NMOS transistor MN1 is coupled to a ground VSS. A gate and a drain of the first NMOS transistor MN1 are coupled at a second node 212, which is coupled to a second terminal of resistor R0. The combined current and voltage reference circuit is configured to provide the first reference voltage Vref1 at the first node 211 and to provide the second reference voltage Vref2 at the second node 212. Further, The combined current and voltage reference circuit is configured to provide the reference current Is flowing through resistor R0 between the first node 211 and the second node 212. In FIG. 2, VDD and VSS designate power supply and ground voltages, respectively.

As shown in FIG. 2, signal generating circuit 220 includes a second PMOS transistor MP2 coupled to the first PMOS transistor MP1 to form a first current mirror. A second NMOS transistor MN2 is coupled to the first NMOS transistor MN1 to form a second current mirror. A first differential pair circuit, including a third PMOS transistor MP3 and a fourth PMOS transistor MP4, are coupled to the second PMOS transistor MP2 to receive reference current Is. Further, a second differential pair circuit, including a third NMOS transistor MN3 and a fourth NMOS transistor MN4, is coupled to the second NMOS transistor MN2 to receive reference current Is. A drain of the third PMOS transistor MP3 and a drain of the third NMOS transistor MN3 are coupled at a third node 223, which is coupled to capacitor C0 for charging and discharging the capacitor.

As shown in FIG. 2, signal generating circuit 220 also includes a first comparator circuit COMP_P that includes a positive input coupled to the third node 223 to sense the voltage on capacitor C0, a negative input coupled to the first reference voltage Vref1, and bias current terminal Ibs coupled to a drain of the fourth NMOS transistor MN4 and a disable signal OSCOUT. Signal generating circuit 220 also has a second comparator circuit COMP_N that includes a negative input coupled to the third node 223 to sense the voltage on capacitor C0, a positive input coupled to the second reference voltage Vref2, and bias current terminal Ibs coupled to a drain of the fourth PMOS transistor MP4 and a disable signal OSCOUTB. Signal generating circuit 220 also has a latch 230, which includes a set input coupled to the output of the first comparator COMP_P, and a reset input coupled to the output of the second comparator COMP_N. Latch 230 is configured to provide oscillator output signal OSCOUT and inverted output signal OSCOUTB. Oscillator output signal OSCOUT is coupled to the gate of the third PMOS transistor MP3 and the gate of the third NMOS transistor MN3. Inverted output signal OSCOUTB is coupled to the gate of the fourth PMOS transistor MP4 and the gate of the fourth NMOS transistor MP4.

Figure 3A:
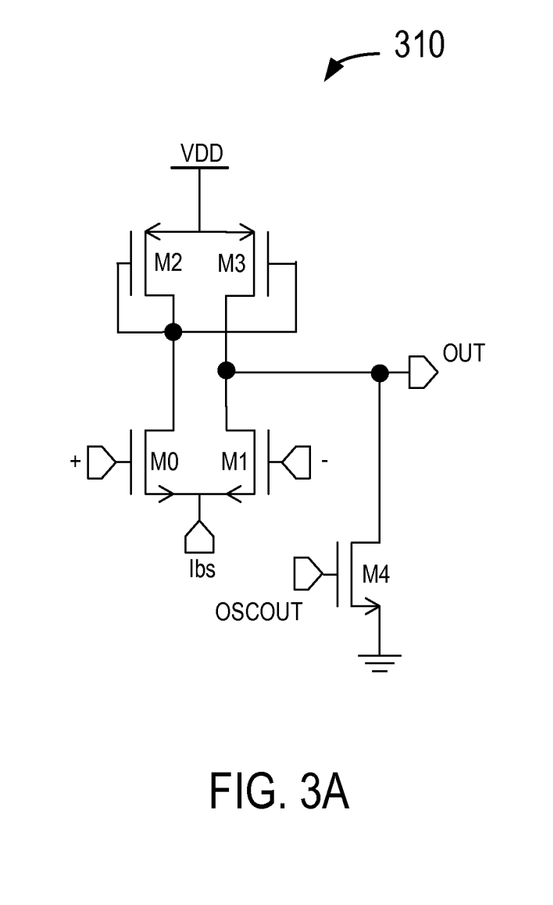
FIGS. 3A and 3B are simplified schematic diagrams illustrating two comparator circuits that can be used in the oscillator and ramp generator of FIG. 2 according to an embodiment of the present invention.
Figure 3B:
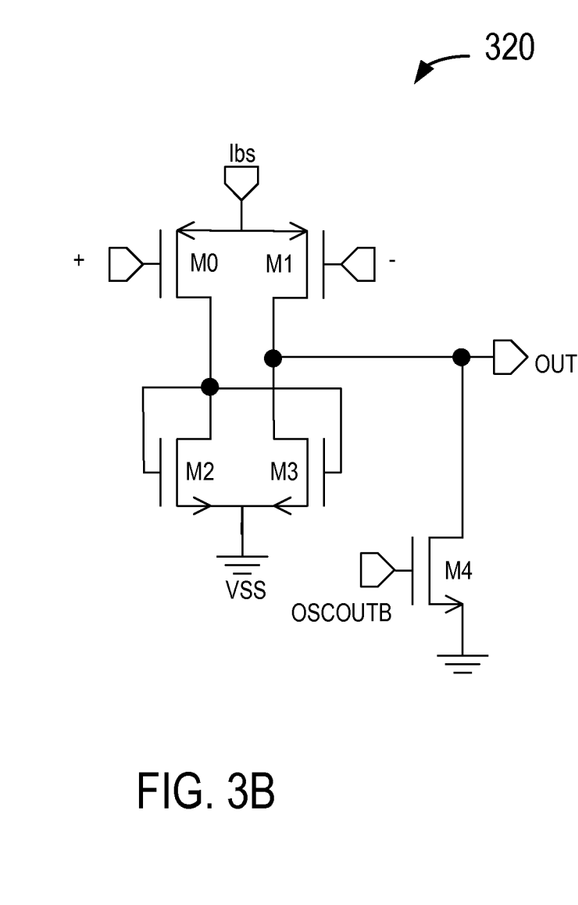

FIGS. 3A and 3B are simplified schematic diagrams illustrating two comparator circuits that can be used in the oscillator and ramp generator of FIG. 2 according to an embodiment of the present invention. FIG. 3A is a simplified schematic diagram for a comparator 310 that can be used as COMP_P in FIG. 2. As shown in FIG. 3A, comparator 310 has four transistors M0, M1, M2, and M3 forming a differential amplifier, and a fifth transistor M4 for controlling the output when the comparator is disabled. A positive input and a negative input nodes are coupled to the gate nodes of transistors M0 and M1, respectively. The Ibs node is configured to receive a bias current signal. The gate of transistor M4 is configured to receive the OSCOUT signal, such that when Ibs=0, the output is to forced zero (which can be VSS or ground) to avoid it to float to VDD. Similarly, FIG. 3B is a simplified schematic diagram for a comparator 320 that can be used as COMP_N in FIG. 2. It can be seen that comparator 320 is similar to comparator 310, with certain polarities reversed. A positive input and a negative input are coupled to the gate nodes of transistors M0 and M1, respectively. The Ibs node is configured to receive a bias current signal. The gate of transistor M4 is configured to receive the OSCOUTB signal, such that when Ibs=0, the output is to forced zero (VSS or ground) to avoid it to float to VDD.

Figure 4A:
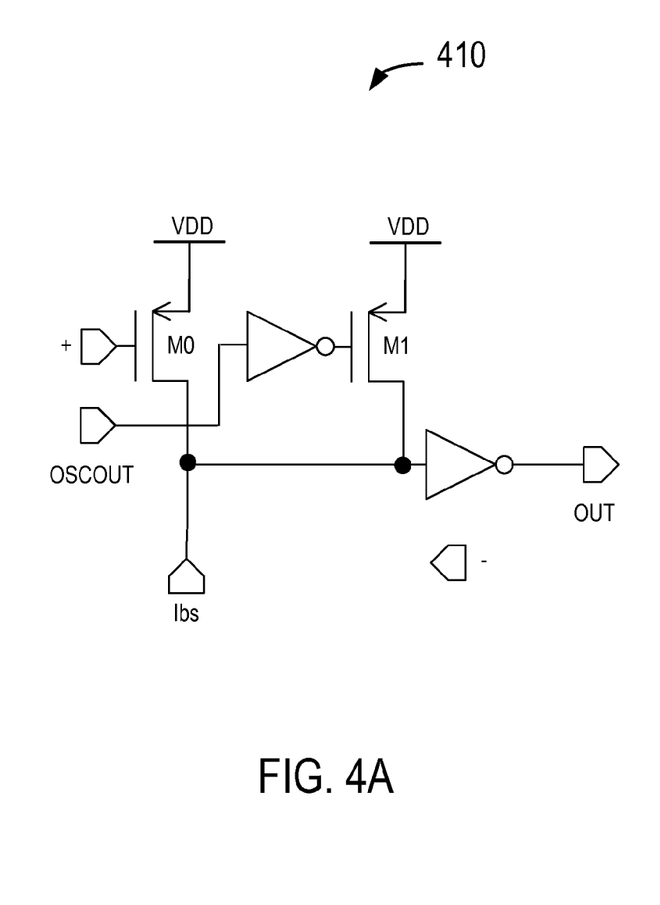
FIGS. 4A and 4B is are simplified schematic diagrams illustrating two comparator circuits that can be used in the oscillator and ramp generator of FIG. 2 according to another embodiment of the present invention.
Figure 4B:
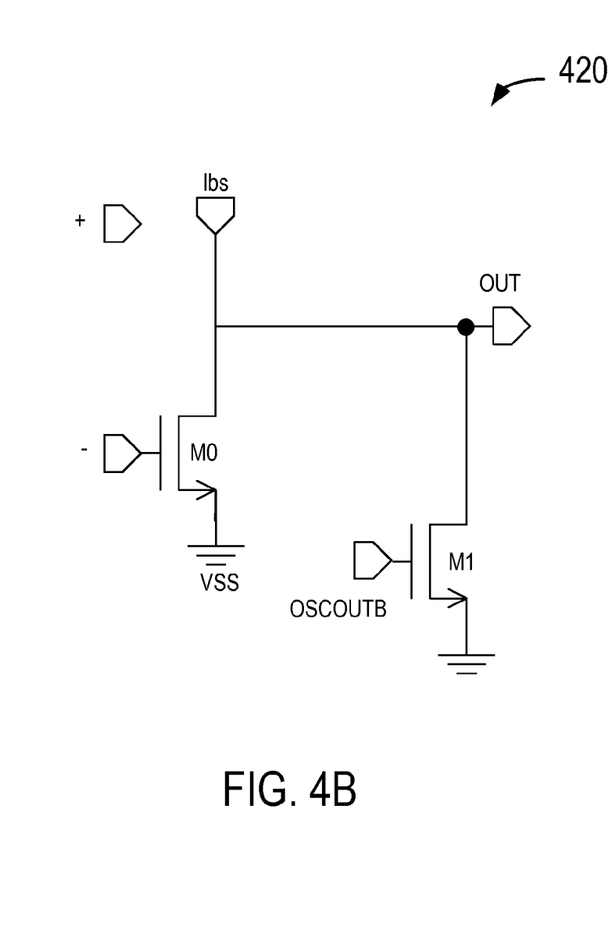

FIGS. 4A and 4B is are simplified schematic diagrams illustrating two comparator circuits that can be used in the oscillator and ramp generator of FIG. 2 according to another embodiment of the present invention. FIG. 4A is a simplified schematic diagram for a comparator 410 that can be used as COMP_P in FIG. 2, and FIG. 4B is a simplified schematic diagram for a comparator 420 that can be used as COMP_N in FIG. 2. Note that comparators 410 and 420 are inverter type comparators, and one of the input terminals (either the positive terminal or the negative terminal) is not used. In both 410 and 420, transistor M0 is chosen to be equal to the corresponding transistor in combined voltage and current reference circuit 210 in FIG. 2. In this arrangement, at the same current Is the gate voltage and drain voltages will be equal, and the switching point is set to Vgs by matching rather than through a differential pair. More specifically, transistor M0 in comparator 410 is matched to transistor MP1 in FIG. 2, and transistor M0 in comparator 420 is matched to transistor MN1 in FIG. 2. In addition, transistor M1 is configured to force the output is to a known voltage, similar to the function of transistor M4 in FIGS. 3A and 3B.

Figure 5:
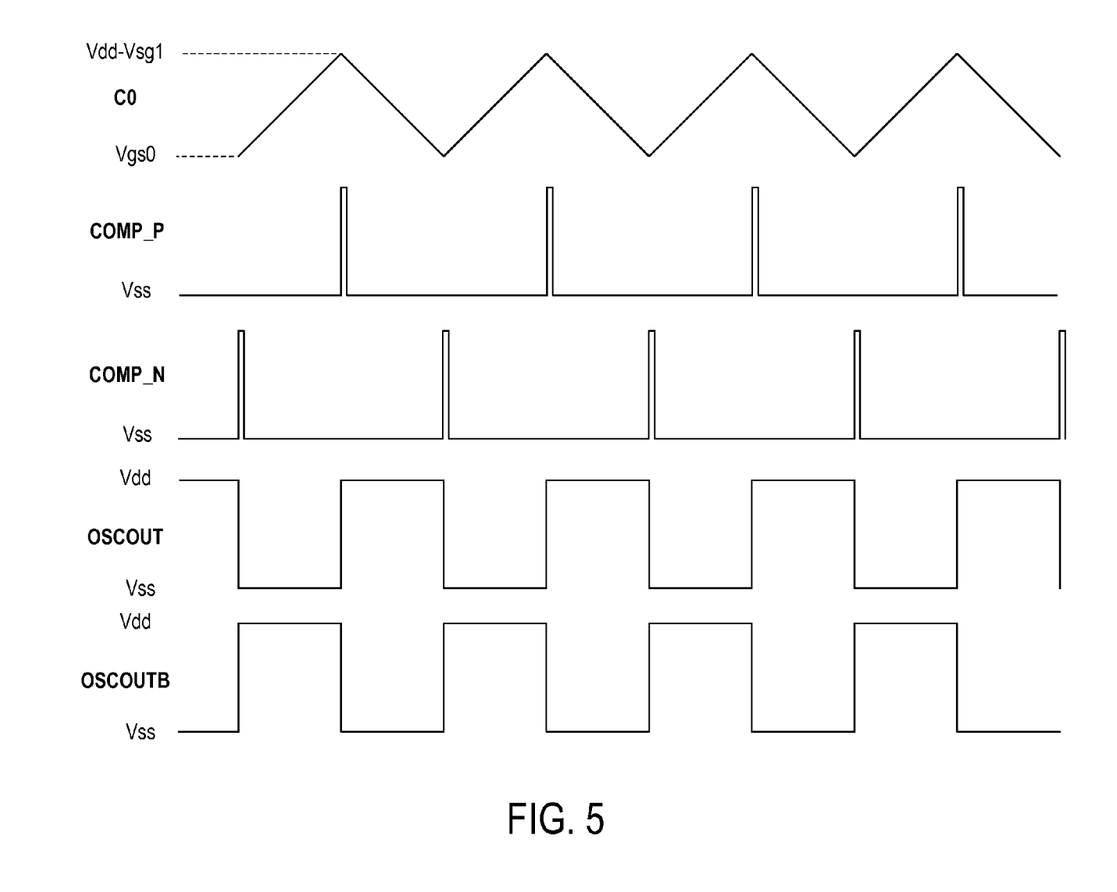
FIG. 5 is a timing and waveform diagram illustrating the operation of the self-biased RC oscillator and ramp generator of FIG. 2 according to an embodiment of the present invention.

FIG. 5 is a timing and waveform diagram illustrating the operation of the self-biased RC oscillator and ramp generator of FIG. 2 according to an embodiment of the present invention. The operation of self-biased RC oscillator and ramp generator circuit 200 can be described with reference to the waveforms illustrated in FIG. 5. As shown in FIG. 2 and described above, first PMOS transistor MP1 is in a diode connection, with its gate and drain nodes tied together at node 211, which provides reference voltage Vref1 at VDD−Vsg1, where Vsg1 is the voltage between the source and gate nodes of PMOS transistor MP1. Similarly, first NMOS transistor MN1 is in a diode connection, with its gate and drain nodes tied together at node 212, which provides reference voltage Vref2 at Vgs0, where Vgs0 is the voltage between the gate and source nodes of NMOS transistor MN1. Further, current Is flows through resistor R0 between reference voltages VDD−Vsg1 and Vgs0. Current Is can be expressed as below, with VSS=0, $$Is=(VDD-Vgs0-Vsg1)/R0$$

Thus, it can be seen that the combined current and voltage reference circuit 210 is configured to provide the first and second voltage references VDD−Vsg1 and Vgs0, as well as current reference Is. By combining the voltage and current references into one circuit branch, the reference circuit is simple and has low power consumption.

As shown in FIG. 2, reference voltage Vref1 is provided to the gate of PMOS transistor MP2 and the negative input terminal of comparator COMP_P, and reference voltage Vref2 is provided to the gate of NMOS transistor MN2 and the positive input terminal of comparator COMP_N. Further, PMOS transistor MP2 forms a current mirror with PMOS transistor MP1 to provide bias current Is to differential pair circuit formed by transistors MP3 and MP4. Similarly, NMOS transistor MN2 forms a current mirror with NMOS transistor MN1 to provide bias current Is to differential pair circuit formed by transistors MN3 and MN4. On the right hand side of the circuit, latch circuit 230 provides output signal OSCOUT and inverted output signal OSCOUTB, both of which are logic signals with voltage levels of high and low represented by VDD and VSS in this embodiment.

In FIG. 2, as described above, OSCOUT and OSCOUTB are used to bias gate terminals of transistors MP3, MP4, MN3, and MN4. When OSCOUT is low or at VSS and OSCOUTB 15 high or at VDD, transistor MP3 and MN4 are turned on, and transistor MN3 and MP4 are turned off. As a result, bias current Is flows through MP3 and onto capacitor C0. Also, comparator COMP_P is biased up at its Ibs terminal by bias current Is flowing through MN4. At this point, comparator COMP_N is disabled. Under this condition, capacitor C0 is charged up, until its voltage reaches Vref1, or Vdd−Vsg1. At that time, the output of comparator COMP_P changes as its positive input starts to exceed the negative input. Now the set input of the latch S goes high, causing OSCOUT to go to VDD and OSCOUTB to go to VSS. At this time MN4 turns off and comparator COMP_P is disabled to save power. At the same time, MP4 turns on to bias comparator COMP_N, and MN3 turns on to discharge C0 from Vdd−Vsg1. Capacitor C0 will be discharged until its voltage reaches Vgs0. At this point, the output of comparator COMP_N changes, which will set the reset input of the latch R to VDD and cause OSCOUT to go back to VDD. The sequence of operation described above are illustrated by the waveforms in FIG. 5.

The frequency of the oscillating signals can be calculated as follows. During the discharge of capacitor C0, its voltage decreases from Vdd−Vsg1 to Vgs0. The time it takes to do so is equal to:

$$Tdischarge=C0\times dV/Is=C0\times (Vdd-Vsg1-Vgs0)/((Vdd-Vgs0-Vsg1)/R0)=R0\times C0$$

When capacitor C0 charges up again, its voltage rises from Vgs0 to Vdd−Vsg1. The time it takes to do so is equal to:

$$Tcharge=C0\times dV/Is=C0\times (Vdd-Vsg1-Vgs0)/((Vdd-Vgs0-Vsg1)/R0)=R0\times C0$$

Therefore, the period of the oscillator is:

$$T=Tdischarge+Tcharge=2\times R0\times C0$$

It follows that the frequency can be expressed as follows:

$$Fosc=1/T=1/(2\times R0\times C0)$$

It can be seen that the oscillator frequency can be precisely determined by the values of one resistance R0 and one capacitance C0. As described above, self-biased RC oscillator and ramp generator circuit 200 is configured to provide low power consumption. At a given time, one of the two transistors in each of the differential pair circuits are disabled, and one of the comparators are disabled. Further, the combined voltage and current reference circuit is formed by a signal branch of two transistors and a resistor, which is a simple circuit with low power consumption.

Figure 6:
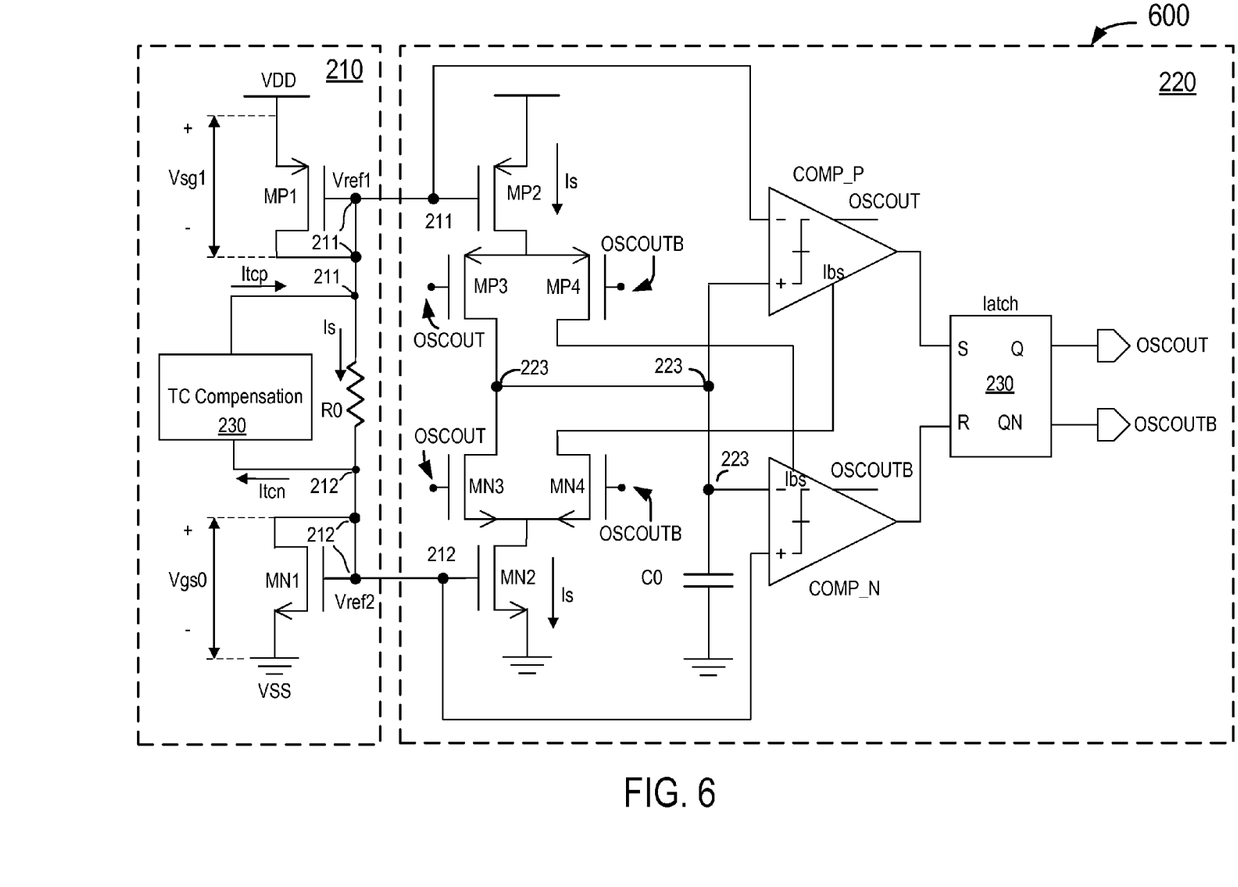
FIG. 6 is a simplified schematic diagram illustrating a self-biased RC oscillator and ramp generator including temperature compensation according to another embodiment of the present invention.

FIG. 6 is a simplified schematic diagram illustrating a self-biased RC oscillator and ramp generator including temperature coefficient compensation according to another embodiment of the present invention. As shown in FIG. 6, self-biased RC oscillator and ramp generator 600 is similar to the self-biased RC oscillator and ramp generator circuit 200 described above in connection with FIG. 2, with the addition of temperature coefficient compensation circuit block 230 coupled to combined current and voltage reference circuit 210. In order to compensate for the temperature effects of the resistor R0, the capacitor C0, and the comparators and current mirrors, temperature compensation network 230 is inserted at the reference nodes 211 and 212, whose voltages are Vdd−Vsg1 and Vgs0, respectively. By inserting a temperature dependent current into the reference nodes, the temperature coefficient of the oscillator can be altered.

Figure 7:
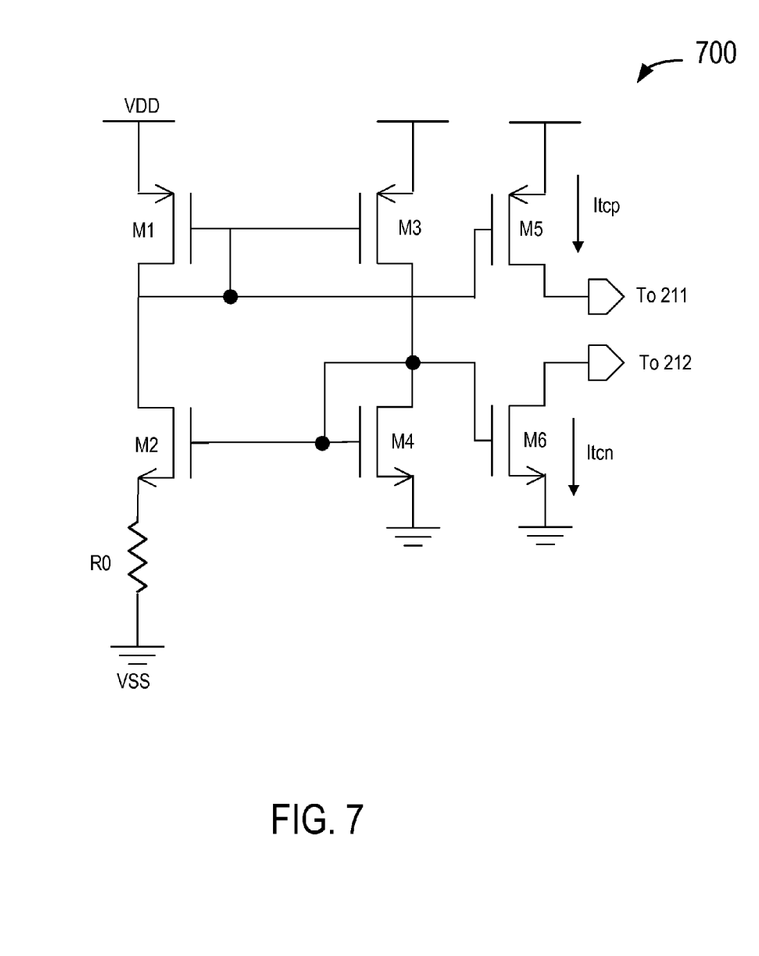
FIG. 7 is a simplified schematic diagram illustrating a temperature coefficient compensation circuit that can be used in the oscillator and ramp generator of FIG. 6 according to an embodiment of the present invention.

FIG. 7 is a simplified schematic diagram illustrating a temperature coefficient compensation circuit that can be used in self-biased RC oscillator and ramp generator 600 in FIG. 6 according to an embodiment of the present invention. As shown in FIG. 7, temperature coefficient compensation circuit 700 includes a first transistor M1, a second transistor M2, and a resistor R0 couple in series between a power supply terminal VDD and a ground terminal VSS. Temperature coefficient compensation circuit 700 also includes a third transistor M3 and a fourth transistor M4 couple in series between the power supply terminal VDD and the ground terminal VSS. The gate nodes of transistors M1 and M3 are tied together, and the gate nodes of M2 and M4 are tied together. The first and the third transistors M1 and M3 have the same channel width to length (W/L) ratio and form a first current mirror. The second transistor M2 has a greater channel width to length (W/L) ratio than the W/L ratio of the fourth transistor M4, and the second and the fourth transistors M2 and M4 form a second current mirror. Temperature coefficient compensation circuit 700 also includes a fifth transistor M5 having a source coupled to the power supply, a gate is coupled to the gates of the first and the third transistors, and a drain configured for coupling to the first node 211 of the combined voltage and current reference circuit 210. Temperature coefficient compensation circuit 700 also includes a sixth transistor M6 having a source coupled to the ground, a gate is coupled to the gates of the second and the fourth transistors, and a drain configured for coupling to the second node 212 of the combined voltage and current reference circuit 210. Note in the example of FIG. 7, transistors M1, M3, and M5 are PMOS transistors, and transistors M2, M4, and M6 are NMOS transistors.

As shown in FIG. 7 and described above, temperature coefficient compensation circuit 700 includes a current mirror comprised of equivalent PMOS transistors M1 and M3 is configured to force the same current to flow through NMOS transistors M2 and M4. In this embodiment, transistors M2 and M4 have different channel width to length (W/L) ratio with the W/L of M2 being larger compared to the W/L of M4. This results in a delta gate-to-source voltage Vgs across a resistor R0. This circuit is configured to generate a positive temperature coefficient (TC) current that can be added or subtracted from the bias reference in the oscillator circuit by different ratios of current mirrors using transistors M5 and M6, allowing TC (temperature coefficient) trim. In some embodiments, appropriate sizes of transistors M5 and M6 can determined, for example, by experiments or based on circuit simulation techniques.

While the above is a description of specific embodiments of the invention, the description should not be taken as limiting the scope of the invention. It is understood that the examples and embodiments described herein are for illustrative purposes only and that various modifications or changes can be made in light thereof. For example, in alternative embodiments, the combined current and voltage reference circuit can be implemented using a single resistor and a single transistor. In one embodiment, the combined current and voltage reference circuit can be implemented using a single resistor and a single PMOS transistor. In another embodiment, the combined current and voltage reference circuit can be implemented using a single resistor and a single NMOS transistor. In these alternative embodiments, either two capacitors are used with currents sources and/or another PMOS and NMOS current mirror is used to provide current in the opposite direction for the comparators and/or the capacitors. Further, even though all the examples have been described using CMOS transistor, the circuits disclosed herein can also be implemented using bipolar transistors including NPN and PNP bipolar transistors. These and other modifications or changes in light thereof can be suggested to persons skilled in the art and are understood to be included within the spirit and purview of this invention.

What is claimed is:

1. An integrated circuit self-biased RC (resistor-capacitor) oscillator and ramp generator circuit, comprising:
   a combined current and voltage reference circuit for providing a reference current, a first reference voltage, and a second reference voltage, the combined current and voltage reference circuit including a circuit branch consisting of a diode-connected first PMOS transistor, a resistor R0, and a diode-connected first NMOS transistor coupled in series; and
   a signal generating circuit including a capacitor, the signal generating circuit being configured to charge and discharge the capacitor between the first reference voltage and the second reference voltage, the signal generating circuit including a comparator circuit for comparing a capacitor voltage with the first reference voltage and the second reference voltage,
   wherein the self-biased RC oscillator and ramp generator circuit is configured to provide a ramp signal at a node of the capacitor and to provide an oscillator output signal at an output of the signal generating circuit.

2. The circuit of claim 1, wherein the self-biased RC oscillator and ramp generator circuit is configured to provide a oscillation frequency of $\frac{1}{2}R_0C_0$, wherein $R_0$ is the resistance of the resistor and $C_0$ is the capacitance of the capacitor.

3. The circuit of claim 1, wherein, in the combined current and voltage reference circuit,
   a source of the first PMOS transistor is coupled to a power supply;
   a gate and a drain of the first PMOS transistor are coupled at a first node, which is coupled to a first terminal of the resistor;
   a source of the first NMOS transistor is coupled to a ground; and
   a gate and a drain of the first NMOS transistor are coupled at a second node, which is coupled to a second terminal of the resistor;
   wherein the current and voltage reference circuit is configured to:
      provide the first reference voltage at the first node;
      provide the second reference voltage at the second node; and
      provide the reference current flowing through the resistor between the first node and the second node.

4. The circuit of claim 3, further comprising a temperature compensation circuit coupled between the first node and the second node.

5. The circuit of claim 4, wherein the temperature compensation circuit comprises:
   a first transistor, a second transistor, and a resistor couple in series between a power supply terminal and a ground terminal;
   a third transistor and a fourth transistor couple in series between the power supply terminal and the ground terminal, wherein:
      the first and the third transistors have the same channel width to length (W/L) ratio and form a first current mirror;
      the second transistor has a greater channel width to length (W/L) ratio than the W/L ratio of the fourth transistor; and
      the second and the fourth transistors forming a second current mirror;
   a fifth transistor having a source coupled to the power supply, a gate is coupled to the gates of the first and the third transistors, and a drain configured for coupling to the first node of the combined voltage and current reference circuit; and
   a sixth transistor having a source coupled to the ground, a gate is coupled to the gates of the second and the fourth transistors, and a drain configured for coupling to the second node of the combined voltage and current reference circuit.

6. The circuit of claim 1, wherein the signal generating circuit comprises:
   a second PMOS transistor coupled to the first PMOS transistor to form a first current mirror;
   a second NMOS transistor coupled to the first NMOS transistor to form a second current mirror;
   a first differential pair circuit coupled to the second PMOS transistor to receive the reference current, the first differential pair circuit including a third PMOS transistor and a fourth PMOS transistor; and
a second differential pair circuit coupled to the second NMOS transistor to receive the reference current, the second differential pair circuit including a third NMOS transistor and a fourth NMOS transistor;
wherein a drain of the third PMOS transistor and a drain of the third NMOS transistor are coupled at a third node, the third node being coupled to the capacitor for charging and discharging the capacitor, the third node also being configured to provide a ramp signal.

7. The circuit of claim 6, further comprising:
a first comparator circuit that includes:
  a positive input coupled to the third node to sense the voltage on the capacitor; and
  a bias terminal coupled to a drain of the fourth NMOS transistor of the signal generating circuit; and
a second comparator circuit that includes:
  a negative input coupled to the third node to sense the voltage on the capacitor; and
  a bias terminal coupled to a drain of the fourth PMOS transistor of the signal generating circuit;
wherein gate voltages of the third PMOS transistor, the fourth PMOS transistor, the third NMOS transistor, and the fourth NMOS transistor are related to outputs of the first and the second comparators.

8. The circuit of claim 7, further comprising a latch, the latch including:
a set input coupled to the output of the first comparator;
a reset input coupled to the output of the second comparator;
a positive output coupled to the gate of the third PMOS transistor and the gate of the third NMOS transistor; and
a negative output coupled to the gate of the fourth PMOS transistor and the gate of the fourth NMOS transistor;
wherein the positive output is configured to provide the oscillator output signal and the negative output is configured to provide the complementary oscillator output signal.

9. The circuit of claim 8, wherein the signal processing circuit is configured to enable the first comparator and disable the second comparator when the capacitor is being charged;
wherein the signal processing circuit is configured to disable the first comparator and to enable the second comparator when the capacitor is being discharged.

10. The circuit of claim 7,
wherein the first comparator includes:
  a current source coupled to the power supply terminal;
  a differential pair coupled to the current source; and
  a bias node coupled to the differential pair;
wherein the second comparator includes:
  a current source coupled to the ground terminal;
  a differential pair coupled to the current source; and
  a bias node coupled to the differential pair.

11. The circuit of claim 7,
wherein the first comparator includes a first transistor having:
  a source coupled to the power supply terminal;
  a gate coupled to the positive input node of the comparator;
  a drain for providing the output of the comparator; and
  a bias node coupled to the drain of the first transistor;
wherein the second comparator includes a first transistor having:
  a source coupled to the ground terminal;
  a gate coupled to the negative input node of the comparator;
  a drain for providing the output of the comparator; and
  a bias node coupled to the drain of the first transistor.

12. A self-biased RC (resistor-capacitor) oscillator and ramp generator circuit, comprising:
a combined current and voltage reference circuit for providing a reference current, a first reference voltage, and a second reference voltage, the combined current and voltage reference circuit including a circuit branch having a first NMOS transistor, a first PMOS transistor, and a resistor coupled in series; and
a signal generating circuit including a capacitor, the signal generating circuit being configured to charge and discharge the capacitor between the first reference voltage and the second reference voltage by using a comparator circuit to compare a capacitor voltage with the first reference voltage and the second reference voltage.

13. The circuit of claim 12, wherein the signal generating circuit is configured to provide a charging current and a discharging current that are equal in magnitude to a current determined by the difference between the first reference voltage and the second reference voltage divided by the resistance of the resistor.

14. The circuit of claim 12, wherein, in the combined current and voltage reference circuit,
a gate and a drain of the first PMOS transistor are coupled at a first node, which is coupled to a first terminal of the resistor; and
a gate and a drain of the first NMOS transistor are coupled at a second node, which is coupled to a second terminal of the resistor;
wherein the current and voltage reference circuit is configured to:
  provide the first reference voltage at the first node;
  provide the second reference voltage at the second node; and
  provide the reference current flowing through the resistor between the first node and the second node.

15. The circuit of claim 12, wherein the first NMOS transistor is in a diode connection with its gate and drain connected together, and the first PMOS transistor is in a diode connection with its gate and drain connected together.

16. The circuit of claim 12, wherein the self-biased RC oscillator and ramp generator circuit is configured to provide a oscillation frequency of $\frac{1}{2}R_0C_0$, wherein $R_0$ is the resistance of the resistor in the circuit branch of the combined current and voltage reference circuit, and $C_0$ is the capacitance of the capacitor.

17. The circuit of claim 12, wherein the signal generating circuit comprises:
a first differential pair and a first comparator for charging the capacitor; and
a second differential pair and a second comparator for charging the capacitor;
wherein the second comparator is disabled during the charging of the capacitor, and the first comparator is disabled during the discharging of the capacitor.

18. The circuit of claim 12, further comprising a temperature compensation circuit coupled between the first node and the second node.

19. A self-biased RC (resistor-capacitor) oscillator and ramp generator circuit, comprising:
a combined current and voltage reference circuit for providing a reference current, a first reference voltage, and a second reference voltage, the combined current and voltage reference circuit including a circuit branch having a first NMOS transistor, a first PMOS transistor, and a resistor coupled in series, and a temperature compensation circuit in parallel with the resistor; and a signal generating circuit including a capacitor, the signal generating circuit being configured to charge and discharge the capacitor between the first reference voltage and the second reference voltage.

20. The circuit of claim 19, wherein the temperature compensation circuit comprises:

a first transistor, a second transistor, and a resistor couple in series between a power supply terminal and a ground terminal;

a third transistor and a fourth transistor couple in series between the power supply terminal and the ground terminal, wherein:

the first and the third transistors have the same channel width to length (W/L) ratio and form a first current mirror;

the second transistor has a greater channel width to length (W/L) ratio than the W/L ratio of the fourth transistor; and the second and the fourth transistors forming a second current mirror;

a fifth transistor having a source coupled to the power supply, a gate is coupled to the gates of the first and the third transistors, and a drain configured for coupling to the first node of the combined voltage and current reference circuit; and a sixth transistor having a source coupled to the ground, a gate is coupled to the gates of the second and the fourth transistors, and a drain configured for coupling to the second node of the combined voltage and current reference circuit.

\* \* \* \* \*